United States Patent [19]
Bontempo et al.

[11] Patent Number: 5,543,739
[45] Date of Patent: Aug. 6, 1996

[54] CONTROL, REDUCTION AND EQUALIZATION OF DELAYS IN A DRIVER STAGE

[75] Inventors: Gregorio Bontempo, Barcellona Pozzo di Gotto; Patrizia Milazzo, Messina; Angelo Alzati, Bollate, all of Italy

[73] Assignees: SGS-Thomson Microelectronics, S.r.l., Agrate Brianza; Consorzio Per La Ricerca Sulla Microelettronica Nel Mezzogiorno, Catania, both of Italy

[21] Appl. No.: 220,845

[22] Filed: Mar. 31, 1994

[30] Foreign Application Priority Data

Apr. 9, 1993 [EP] European Pat. Off. ............ 93830158

[51] Int. Cl.⁶ .................... H03K 17/04; H03K 17/687
[52] U.S. Cl. .................. 327/108; 327/170; 327/306; 327/379; 327/387; 327/374; 326/17
[58] Field of Search .................... 327/432, 379, 327/427, 377, 376, 375, 392, 393, 398, 374, 108, 170, 306, 387; 326/17, 20

[56] References Cited

U.S. PATENT DOCUMENTS

| 4,504,779 | 3/1985 | Haman | 323/349 |
|---|---|---|---|
| 5,017,816 | 5/1991 | Wilcox | 327/432 |
| 5,204,562 | 4/1993 | Pace | 322/432 |
| 5,289,051 | 2/1994 | Zitta | 322/379 |

FOREIGN PATENT DOCUMENTS

| 225567 | 7/1985 | Germany. |
|---|---|---|
| 259944 | 9/1988 | Germany. |

OTHER PUBLICATIONS

Patent Abstracts of Japan, vol. 13, No. 468 (E–834)(3816) Oct. 23, 1989 & JP-A-11 83 214 (Toyota Autom Loom Works Ltd) Jul. 21, 1989 *abstract*.

Patent Abstracts of Japan, vol. 10, No. 356 (E–459)(2412) Nov. 29, 1986 & JP-A-61 154 311 (Toshiba Corp) Jul. 14, 1986 *abstract*

Thomson CSF GMBA, Technische Informationen Nr. 34/77, K. Rischmuller: "Basisansteuerung von Hochvolt–Schalttransistoren", pp. 1–31 *pp. 14–17; Figures 11A, 11B* (no translation).

Primary Examiner—Timothy P. Callahan
Assistant Examiner—Dina T. Le
Attorney, Agent, or Firm—Robert Groover; Betty Formby

[57] ABSTRACT

The turn-off delay time of a low-side driver (output power transistor), may be independently reduced and eventually made identical to the turn-on delay time by employing an auxiliary current generator that may be controlled by the same switching signal that controls a current generator employed for discharging the control node of the low-side driver, in order to provide an augmented discharging current during a first phase (only) of a turn-off process. The contribution to the capacitance discharge current provided by said third current generator is automatically interrupted by means responsive to the voltage present on the driving node of the low-side driver, when it approaches saturation.

30 Claims, 3 Drawing Sheets

FIG. 6A

CONTROL, REDUCTION AND EQUALIZATION OF DELAYS IN A DRIVER STAGE

CROSS-REFERENCE TO RELATED APPLICATION

This application claims priority from EPC App'n 93830158.7, filed Apr. 9, 1993, which is hereby incorporated by reference.

BACKGROUND OF THE INVENTION

The present invention relates to a control circuit for an output power transistor (low-side driver) having means for reducing and controlling switching delays and which permits to make the turn-off and the turn-on delays of the output signal substantially identical.

Many power ICs are required to drive toward ground external loads connected to a supply line (low-side driver). The power switch that is commonly employed in these ICs, whenever the fabrication technology will permit it, is an—integrated DMOS transistor, because it offers numerous advantages as compared with a bipolar transistor of similar power rating.

By driving the gate of the DMOS, its drain voltage Vd (which is equal to drain/source voltage Vds when the source is grounded), i.e. the voltage (signal) on the output node of the low-side driver stage, varies between Vds=Rdson*Id and Vds=H.V., wherein Rdson is the resistance of the power transistor when it is conducting, Id is the drain current flowing through the power transistor, and H.V. is the supply voltage of the external load.

In order to minimize the power dissipated through the power transistor when it is conducting, it is necessary to minimize its Rdson. This is obtained by applying to the gate a voltage higher than the grounded source potential of the power transistor by a well defined quantity, equal to about 10 V (overdrive voltage). Most often in practice, the supply voltage Vcc of the integrated circuit is applied to the gate of the output power transistor during a conduction phase.

Figure 1:
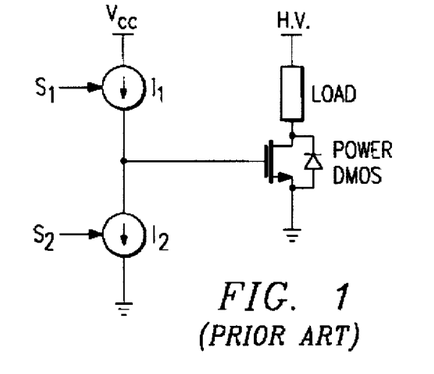
FIG. 1 is a functional diagram of a driving circuit according to a prior art, as already described above.

A control circuit that is normally used for driving an output power DMOS transistor is schematically depicted in FIG. 1.

Figure 2:
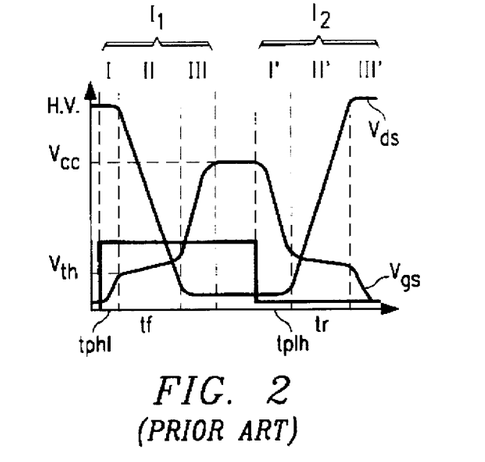
FIG. 2 is a time diagram of the drain/source and of the gate/source voltages of the output power transistor during a turn-on phase and during a turn-off, phase in the case of a driving circuit as the one depicted in FIG. 1.

The current generators I1 and I2, driven by the switching signals S1 and S2 in phase opposition to each other, have the function of charging and discharging, respectively, the capacitance of the driving node (gate) of the power DMOS. FIG. 2 shows the time-diagram of the gate and drain voltages of the power transistor during a turn-on phase and during a turn-off phase. Three distinct operating regions of the characteristics may be observed in both phases.

During a turn-on, in a first zone I of the characteristic, the gate voltage rises from Vgs=0 V to Vgs=Vth (threshold voltage). In this region of the characteristic, there isn't any flow of current through the power transistor and the current I1 charges the gate capacitance: Cgs+Cgd.

In a second region II of the characteristic, the output power transistor starts to conduct, its drain voltage drops from Vds=H.V. to Vds=Von=Rdson*Id while the current I1 continues to charge the gate capacitance which in this phase is given by Cgs+Cgd(Vds/Vgs), where the term: Cgd(Vds/Vgs) is due to the so-called Miller effect. In this zone of the characteristic, also referred to as the saturation zone, the gate voltage does not change much because the contribution to the input capacitance due to the Miller effect is preponderant in respect to the physical capacitance Cgs between gate and source of the transistor.

In a third zone III, also known as the "triode operation" zone, the output power transistor is fully on, its input capacitance having been charged completely, up to the maximum driving voltage (Vcc). In this region, the drain voltage Vds does not change much. Vcc represents the overdrive voltage that serves to minimize the Rdson of the power transistor.

The interval of time, during which the transistor functions in the second zone II of the characteristic curve, determines the so-called fall time (tf) of the output signal, present on the drain node of the output transistor while the interval of time, during which the transistor functions in the zone I of the characteristics curve, defines the so-called turn-on delay time (tphl) as referred to an input signal.

The behavior of the output DMOS in a "turn-off" phase is similar to its behavior during a "turn-on" phase. That is, the gate capacitance discharges through three distinct phases. The duration of the first zone I' defines a turn-off delay time (tplh) and the interval of time during which the transistor functions in the second zone II' during a turn-off phase determines a rise time (tr).

From a qualitative analysis of the switching phases of the power DMOS, it may be concluded that the rise time (tr) is equal to the fall time (tf) if I1=I2, while the turn-off (tplh) and turn-on delays (tphl), as referred to a driving (input) signal, are different from each other.

This is due to the fact that, in order to bring the DMOS to an on state (at the start of the saturation zone II) the variation of the gate voltage will be: ΔVgs1=Vth, while in order to pass from the so-called "triode" operation zone to the zone where the Miller effect occurs, the variation of the gate voltage will be: ΔVgs2=(Vcc−Vgson), where Vgson is the gate voltage at which the DMOS may be considered to be fully on. If the generators I1 and I2 have the same value, by being ΔVgs2>ΔVgs1, the turn-off delay time results greater than the turn-on delay time.

In many practical applications of the circuit, it is often required that the output signal, i.e. the drain voltage (Vds) of the output power transistor, have a "length" identical to the "length" of the driving signal. This requires concurrence of both conditions: tr=tf and tphl=tplh.

SUMMARY OF THE INVENTION

The main aim of the present invention is to provide a control circuit to drive an output power transistor, which will permit control of switching delays as well as rise and fall times. The invention is directed especially to minimize and make symmetric the delay times.

These objects are fully met by the circuit of the present invention, which is characterized by the fact that an auxiliary third current generator, driven by a third signal is employed in order to provide an additional discharge current of the driving node capacitance of the output power transistor, during a first phase of the discharge process and until the output power transistor is near to reach a state of saturation.

In this way, while retaining control and desirably leaving unaltered and identical to each other the rise time and the fall time (by employing for this purpose identical current generators: $I_1=I_2$), through the action (limited in time) of a third or auxiliary current generator, the turn-off delay (tplh) may be effectively controlled and eventually made identical to the turn-on delay time (tphl).

DETAILED DESCRIPTION

Figure 3:
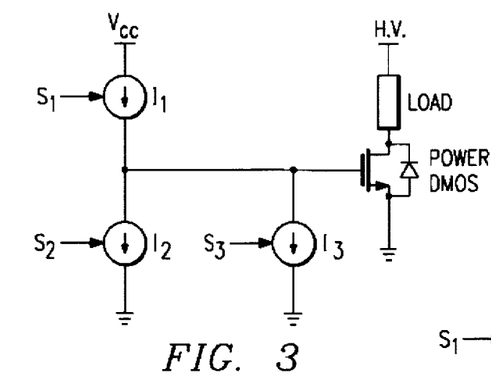
FIG. 3 is a functional diagram of a driving circuit made according to the present invention.
Figure 3A:
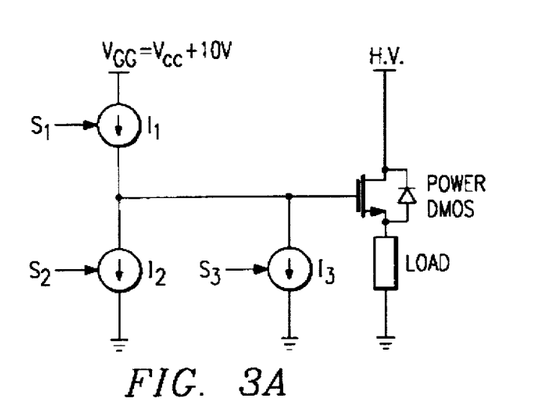
FIG. 3A is a functional diagram of a driving circuit made according to the present invention for a high side driver.

A basic diagram of a driving circuit made according to the present invention is schematically depicted in FIG. 3. As will be easily understood to one skilled in the art, the driving circuit of the present invention can be used to control a power transistor driving a load connected to a ground node toward a supply line (high-side driver). An adaptation to a high-side driver configuration is shown in FIG. 3A.

According to the invention, the driving circuit is provided with a third constant current generator $I_3$ that is controlled by a third switching signal $S_3$.

Basically, the invention rests on the fact that, in a turn-off phase, the current generators $I_2$ and $I_3$ are activated at the same instant, by $S_2$ and $S_3$, for discharging the gate capacitance of the power DMOS in a certain desired time (tplh).

Figure 4:
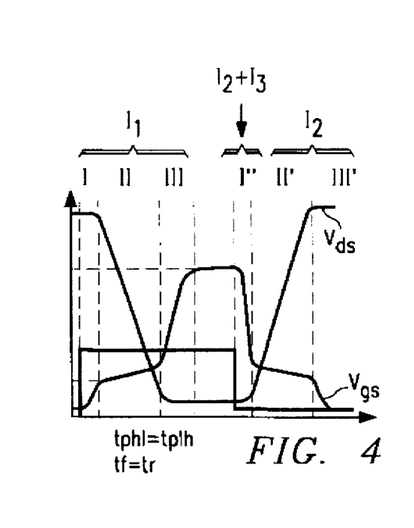
FIG. 4 is a time diagram of the drain/source and of the gate/source voltages of the output power transistor, that may be obtained with a driving circuit of the invention.

When the DMOS enters saturation (zone II'), the third current generator $I_3$ is disactivated by $S_3$. Thereafter the gate capacitance continues to discharge only through the current imposed by the $I_2$ generator. In this way, the rise time remains defined solely by the current $I_2$ and therefore may be kept identical to the fall time, by making $I_1=I_2$. Conversely, the turn-off delay (tplh) is determined by the sum of the $I_2$ and $I_3$ currents $(I_2+I_3)$, thus permitting, through an appropriate dimensioning of the "additional" discharge current $I_3$, to make it identical to the turn-on delay time (tphl) that would otherwise be shorter, for the reasons set forth before. The time-base diagrams of the gate and drain voltages of the output power DMOS transistor are shown in FIG. 4.

Figure 5:
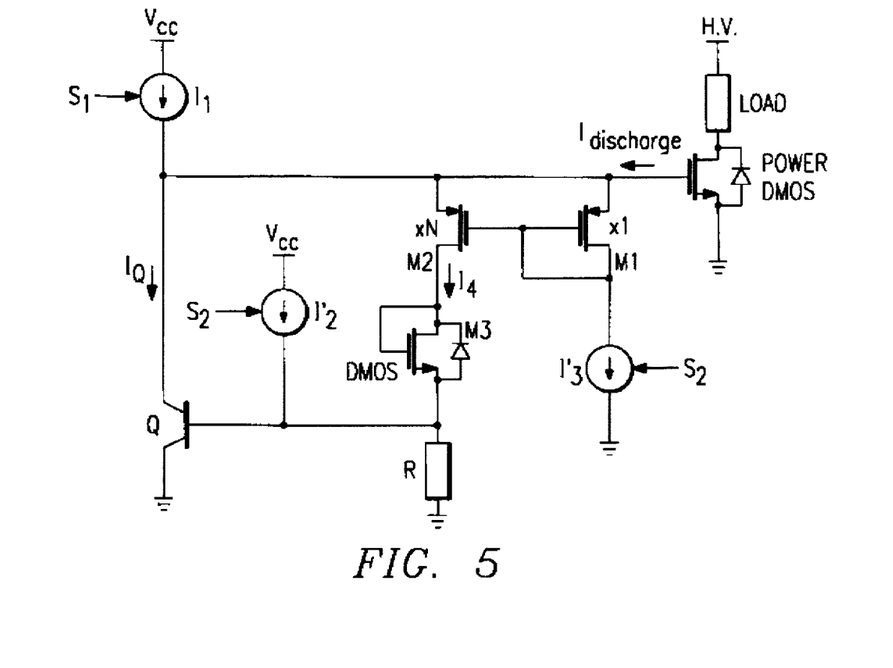
FIG. 5 is the diagram of a driving circuit according to a first embodiment of the present invention.

A practical embodiment of the driving circuit of the invention may be as shown in FIG. 5.

According to this embodiment, the "disactivation" of the third (auxiliary) constant current generator $I_3$, that provides an additional discharge current during a first phase of a turn-off process, takes place automatically due to the drop of the gate voltage of the output power transistor (POWER DMOS) during a turn-off phase, when the power transistor ceases to function as a "triode" and enters saturation. According to this preferred embodiment, it is no longer necessary to generate a dedicated control signal $S_3$, as will be better described below.

The discharge of the gate capacitance of the power DMOS takes place through an amplifying stage that may be constituted by a transistor Q. The amplifying stage, that is the transistor Q, should preferably have a gain that is reasonably independent of process spread and temperature. The transistor Q is driven by a second constant current generator $I'_2$, controlled by the $S_2$ signal. The $S_2$ signal may be complementary to a signal $S_1$, which controls the charge of the gate capacitance during a turn-on phase, according to a known functional diagram.

This second current generator $I'_2$ may deliver a current whose contribution to the driving node capacitance discharge current $I_{discharge}$, given by $\beta_Q.I'_2$, is equal to the current produced by the current generator $I_1$, where $\beta_Q$ is the current gain of the transistor Q.

According to the present invention, to the driving current of the amplifying transistor Q, an "overdrive" current $I_4$ is added (which is fully injected into the base of the transistor Q because the current that flows through the resistance R can be neglected).

According to the embodiment shown, such an "overdrive" current $I_4$ may be generated by the use of a third constant current generator $I'_3$, which may be controlled by the same signal $S_2$ that controls the second current generator $I'_2$.

The third current generator $I'_3$ drives a current mirror that may have a certain mirroring ratio (N) and be constituted by the pair of transistors M1 and M2.

In practice, the output current of the M1–M2 current mirror is entirely injected into the base of Q, because the current flowing through the resistance R is negligible. By implementing a large mirror ratio, the current $I'_3$, generated by the third constant current generator, may have a negligible value as compared with other contributions to the discharge current $(I_{discharge})$ of the driving node (gate) of the output power transistor (POWER DMOS).

Interruption of the additional driving current $I_4$ to the discharge transistor Q, just before the power DMOS comes out of a "triode" operation zone (in order not to influence the rise time of the output signal), is achieved by employing a transistor M3. Preferably, the M3 transistor should have a structure similar to the power transistor used in the low-side driver stage. In this way, the transistor M3 will substantially have the same characteristics of variation of its threshold voltage due to process spread and temperature as the power transistor. In the example shown, both are DMOS transistors. In a sample implementation, the transistor M3 should have an integration ratio W/L=6.5 µm/µm (width/length of the channel) for a power DMOS with a ratio 15,000 µm/4 µm.

During a turn-off phase, the driving node (gate) capacitance of the power DMOS transistor will discharge initially with a current equal to the sum of the multiple contributions:

$$I_{discharge}=\beta_Q I'_2+\beta_Q I_4+I'_3+I_4 \quad (1)$$

where $\beta_Q$ is the current gain of the discharge transistor Q, which is assumed to be independent from process spread and temperature, and the current $I_4$ is given by $I'_3$ times the ratio of the current mirror formed by the transistors M1 and M2.

Therefore, in the equation (1), the term $\beta_Q(I'_2+I_4)$ shown in FIG. 5 as the current $I_Q$ discharged through the transistor Q, is preponderant as compared to the other terms which may be neglected in a first approximation. The gate/source voltage present on the driving node of the power DMOS transistor will be given by:

$$Vgs(DMOS) = Rdson(M2)*I_4 + Vgs(M3) + Vbe(Q) \quad (2)$$

When Vgs(M3) equals the threshold voltage Vth(M3), the M3 transistor ceases to conduct. The Vgs(DMOS) voltage at which this occurs may be in practice around a voltage at which the power DMOS transistor may be considered as having already reached saturation. This fact may marginally influence the rise time. Nevertheless, by suitably adjusting the current I'$_3$, it is possible to "accelerate" the discharge process in order to make the turn-off delay equal to the turn-on delay (tphl=tplh).

Figure 5A:
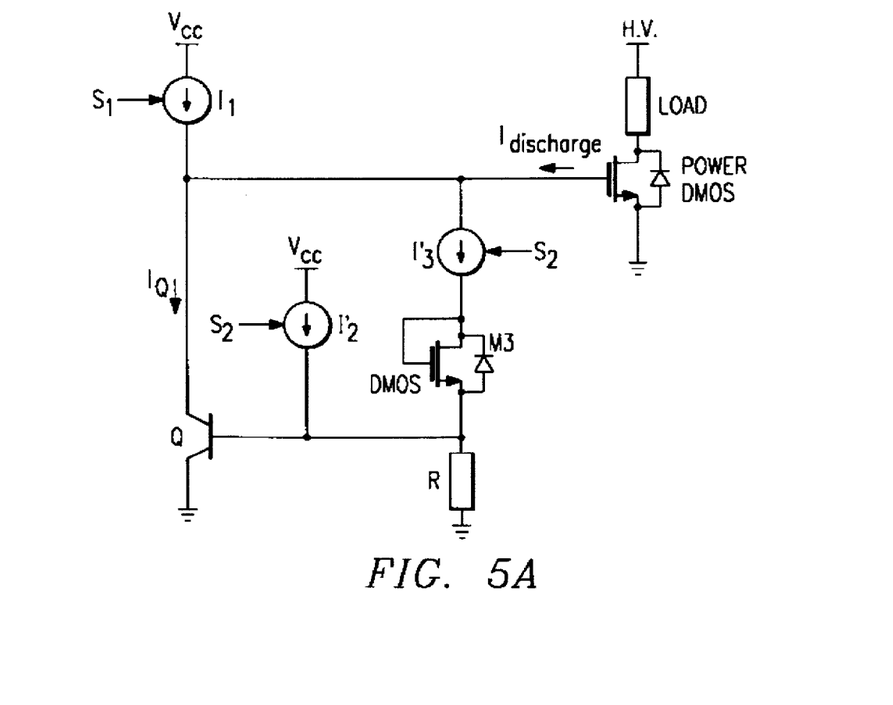
FIG. 5A is the diagram of a driving circuit according to a generalization of the first embodiment of the invention.

As can be easily understood, the current mirror M1–M2 of FIG. 5 may be also omitted without changing the principles of operation of the circuit. Such a driving circuit is shown in FIG. 5A.

Figure 6:
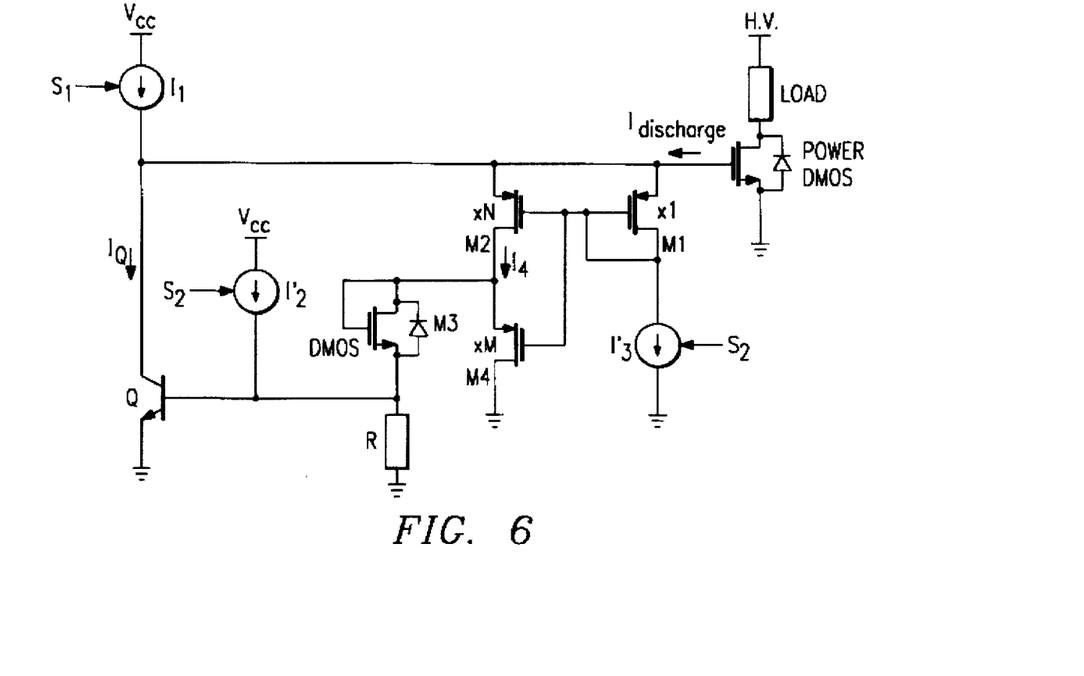
FIG. 6 is the circuit diagram of a second embodiment of a driving circuit of the present invention.

According to an alternative embodiment of the circuit of the invention, shown in FIG. 6, it is also possible to ensure a precise control (equalization) of the signal fronts.

The problem of ensuring a turn-off of the M3 transistor at a slightly higher voltage which would coincide with a definitely occurred exit from the "triode" operation zone by the power DMOS, though not yet entered in a saturation zone, may be effectively resolved by introducing an additional transistor M4, having a size appropriate to divert to ground the current I$_4$.

By referring to FIG. 6, through the additional transistor M4 normally would not flow current because its source voltage is less than its gate voltage. In fact, the voltages on the node A and B of the circuit are given by the following equations:

$$V(A) = Vgs(M3) + Vbe(Q)$$

$$V(B) = Vgs(DMOS) - Vgs(M2)$$

As the voltage on the driving node (gate) of the power DMOS transistor decreases, also the V(B) voltage decreases, while the V(A) voltage remains constant because the current I$_4$ is constant. When the following condition occurs:

$$V(B) \leq V(A) - Vth$$

the transistor M4 turns-on, thus diverting part of the I$_4$ current that flows through the M3 transistor. The voltage at which the transistor M4 is fully on and therefore capable of drawing the whole current I$_4$, by diverting it directly to ground, is given by the following relation:

$$(Vgs(M4) - Vth(M4)) = I_4/(k*W/L) = Vgs(M3) + Vbe(Q) - Vgs(DMOS) - Vgs(M1)$$

By knowing the value of the gate voltage of the power DMOS transistor that corresponds to the exit from the "triode" operation zone, and having established the Vgs(M1) from the value of the current I'$_3$, and having designed a certain area ratio between M1 and M2, it is possible to determine the so-called "aspect ratio" (W/L) (width/length of the channel) of the transistor M4 from the above equation.

A correct dimensioning of the M4 transistor will ensure a precise cut-off instant of the M3 transistor, just before the power DMOS enters saturation, during a turn-off phase. In a sample implementation, the ratio width/length of the transistors should be the following: 5.5 μm/7 μm for M1, 77 μm/7 μm for M2, 6.5 μm/4 μm for M3, and 100 μm/7 μm for M4, in case the power DMOS has a ratio of 15,000 μm/4 μm.

Figure 6A:
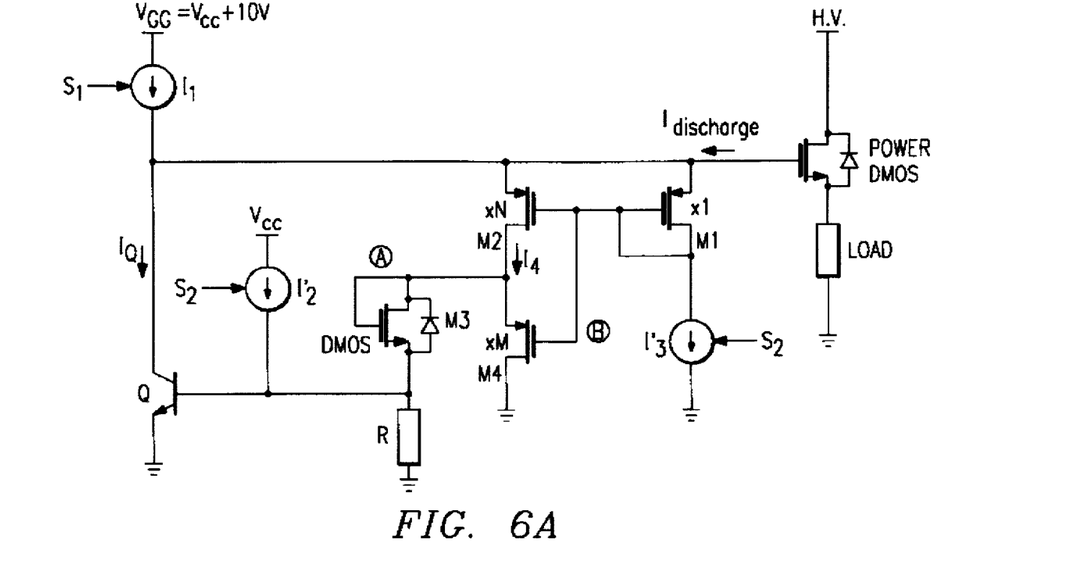
FIG. 6A is the diagram of an adaptation of the same second embodiment to a high-side driver.

An alternative application of the circuit of FIG. 6 for a high-side driver is shown in FIG. 6A.

In practice, the driving circuit of the invention permits to separately set the charge and discharge current levels of the gate of the power transistor in order to obtain controlled rise and fall times, as well as to adjust the turn-off delay time and eventually make it equal to the turn-on delay time, by suitably adjusting the current I'$_3$. It is possible to apply the invention also to discrete power devices. In this case, it is necessary that the electrical characteristics of the discrete power and the relative temperature spreads be identical to those of the integrated transistor M3.

Thus there is provided, for example, An integrated control circuit for connection to a power transistor driving a load, comprising: a first current generator controlled by a first switching signal and connected to turn on the power transistor charging the capacitance of a driving node thereof by means of a charge current; a current amplifying stage connected to turn off the power transistor by discharging the capacitance of the driving node thereof, at a rate which is dependent on a total control current received by the current amplifying stage; a second current generator controlled by a second switching signal, complementary to the first switching signal, connected to supply a first control current to a driving node of the current amplifying stage; a diode configured transistor connected to the driving node of the current amplifying stage to provide a second control current; and a third current generator controlled by the second switching signal, and operatively connected to supply a current proportional to the second control current to the diode configured transistor; the diode configured transistor being operatively connected to sense the value of the voltage at the driving node of the power transistor and accordingly to impede the passage of the second control current toward the current amplifying stage when the power transistor is close to a saturation condition; wherein the current amplifying stage consists of a transistor; and wherein the transistor constituting the amplifying stage has a gain independent on process spread and temperature.

There is also provided, for example, a method of symmetrically turning on and turning off a power transistor driving a load, by charging and discharging the capacitance of an input node thereof, comprising the steps of: turning on the power transistor in a first sequence of time-controlled steps, including bringing the power transistor to a begin-saturation condition corresponding to beginning of conduction, when the input voltage at the input driving node attains a threshold value, by means of a first input charging current, during a turn-on delay time depending on the value of the first input charging current; bringing the power transistor to a condition of full conduction, when the output voltage at a node connected to the load falls to a lower on value, by means of the first input charging current, during a fall time depending on the value of the first input charging current; stabilizing the conduction operation of the power transistor raising the input voltage to a maximum value of operation, by means of the first charging current; turning off the power transistor, in a second symmetrical sequence of time-controlled steps, including bringing the power transistor to operate in a end-saturation condition corresponding to ending of conduction, when the input voltage at the input driving node attains a value close to the threshold value, by means of second and third output discharging currents, during a turn-off delay time depending on the value of the second and third discharging currents; bringing the power transistor to be completely off, when the output voltage at a node connected to the load rises to a higher off value, by means of the second output discharging current, during a rise time depending on the value of the second output discharging current; stabilizing the off condition of the power transistor, when the input voltage attains a zero value, by means of the second output discharging current; the turn-on delay time being equal to the turn-off delay time, and the fall time being equal to the rise time.

What is claimed is:

1. A control circuit, coupled to a driving node of a power transistor, for switching a load toward ground through said power transistor, comprising:

a first current generator, coupled to said driving node and controlled by a first switching signal producing a current for charging said driving node of the power transistor during a turn-on process;

a second current generator, controlled by a second switching signal which is complementary to said first switching signal, producing a current for discharging the driving node of the power transistor during a turn-off process; and a third current generator, coupled to said driving node, controlled by a third switching signal, and producing an additional current for discharging said driving node only during a first phase of said turn-off process, until the power transistor has reached a near saturation condition;

a capacitance discharge current amplifier connected between the driving node of the power transistor and said ground and driven by the sum of said discharge current, produced by said second current generator controlled by said second switching signal, and of said additional current that is produced through an output branch of a current mirror, connected between the driving node of the power transistor and said ground and driven by said third current generator, which is controlled by a replica of said second switching signal; and circuitry connected to said capacitance discharge current amplifier and said third current generator, for interrupting said additional driving current of said capacitance discharge current amplifier when the voltage on the driving node of the power transistor drops to a value close to that of saturation of the power transistor; wherein said circuitry for interrupting said additional driving current comprises a diode-configured transistor connected to said output branch of said current mirror.

2. The control circuit of claim 1, wherein the power transistor and said diode-configured transistor are both DMOS transistors.

3. The control circuit of claim 1, further comprising a transistor operatively connected between said output branch of said current mirror and said ground and having a control terminal which is connected in common with the control terminals of a pair of transistors that form said current mirror, said transistor having a size as to turn-on when the voltage on the driving node of the power transistor drops to a preset value, thus diverting to the ground the output current of said current mirror.

4. An integrated control circuit, coupled to a driving node of a power transistor, for switching a load to ground, comprising;

a first current generator controlled by a first switching signal and connected for generating a charge current to turn on the power transistor by charging a driving node thereof by means of a charge current;

a current amplifying stage connected to turn off said power transistor by discharging the driving node thereof, at a rate which is dependent on a total control current received by said current amplifying stage;

a second current generator, controlled by a second switching signal, complementary to said first switching signal, and connected to supply a first control current component to said current amplifying stage;

a diode configured transistor connected to provide a second control current to said current amplifying stage; and a third current generator, coupled to said drive node and said diode configured transistor controlled by said second switching signal, and operatively connected to supply a current proportional to said second control current to said diode configured transistor;

said diode configured transistor being operatively connected to sense the value of the voltage at said driving node of said power transistor and accordingly to impede the passage of said second control current toward said current amplifying stage when said power transistor is close to a saturation condition.

5. The integrated control circuit of claim 4, further comprising a current mirror connected between said diode configured transistor and said third current generator to provide said second control current to said diode configured transistor.

6. The integrated control circuit of claim 5, wherein said current mirror has a high current mirror ratio.

7. The integrated control circuit of claim 5; further comprising a first transistor, coupled between said diode configured transistor and said ground, and having a control terminal which is connected in common with the control terminals of a pair of transistors that form said current mirror, to divert to said ground said current from said third current generator when the value of the voltage at said driving node of the power transistor reaches a predetermined value.

8. The integrated control circuit of claim 7, wherein said transistor has a width/length ratio such as to turn on after the power transistor exits from a triode operation condition and before the power transistor reaches a saturation condition.

9. The integrated control circuit of claim 4, wherein said current amplifying stage consists of a second transistor.

10. The integrated control circuit of claim 9, wherein said second transistor constituting said current amplifying stage is a bipolar transistor.

11. The integrated control circuit of claim 9, wherein said second transistor has a gain independent of process spread and temperature.

12. The integrated control circuit of claim 4, wherein said diode configured transistor has structural characteristics similar to that of the power transistor.

13. The integrated control circuit of claim 4, wherein said diode configured transistor and said power transistor are DMOS.

14. An integrated driver circuit, comprising;

a power transistor to drive the load;

a first current generator, coupled to a driving node of said power transistor, controlled by a first switching signal and connected to turn on said power transistor by charging said driving node thereof by a charge current;

a discharge transistor connected to said driving node to produce an amplified discharge current to turn off said power transistor by discharging the driving node thereof;

a second current generator controlled by a second switching signal, complementary to said first switching signal, connected to supply a first discharge current to a control node of said discharge transistor;

a diode configured transistor connected to said control node to provide a second discharge current;

a current mirror connected to provide said second discharge current to said diode configured transistor, said current mirror being connected to be powered from said driving node of said power transistor; and a third current generator controlled by said second switching signal connected to said current mirror to supply a current proportional to said second discharge current to said current mirror;

said diode configured transistor being coupled between said current mirror and said control node to sense the value of the voltage at said driving node of said power transistor and accordingly to impede the passage of said second discharge current toward said discharge transistor when said power transistor is close to a saturation condition.

15. The integrated driver circuit of claim 14, wherein said current mirror has a high current mirror ratio.

16. The integrated driver circuit of claim 14, further comprising a first transistor, coupled between said diode configured transistor and ground, and having a control terminal which is connected in common with the control terminals of a pair of transistors that form said current mirror, to divert to ground said current from said third current generator when the value of the voltage at said driving node of the power transistor reaches a predetermined value.

17. The integrated driver circuit of claim 16, wherein said transistor has a width/length ratio such as to turn on after the power transistor exits from a triode operation condition and before the power transistor reaches a saturation condition.

18. The integrated driver circuit of claim 14, wherein said discharge transistor is a bipolar transistor.

19. The integrated driver circuit of claim 14, wherein said discharge transistor has a gain independent on process spread and temperature.

20. The integrated driver circuit of claim 14, wherein said diode configured transistor has structural characteristics similar to that of the power transistor.

21. The integrated driver circuit of claim 14, wherein said diode configured transistor and said power transistor are DMOS.

22. The integrated driver circuit of claim 14, wherein said power transistor is a power DMOS.

23. A method for reducing the turn-off delay time of a power transistor, a driving node of which is charged and discharged by means of first and second current generators, coupled to said driving node, controlled respectively by a first control signal, which is in phase opposition to a second control signal, to respectively charge and discharge the gate of the power transistor, comprising the steps of:

generating an additional discharge current by means of a third current generator which is controlled to turn on by a third control signal, which is in phase with said second control signal of said second current generator;

sensing the reaching by the voltage on said driving node of the power transistor of a value close to the saturation value; and interrupting said additional discharge current before the power transistor enters saturation;

wherein said generating step uses at least one current mirror.

24. The method of claim 23, wherein said at least one current mirror is connected to pass said additional discharge current into a diode configured transistor, and said step of interrupting uses a transistor having a control terminal which is connected in common with the control terminals of a pair of transistors that form said current mirror, to divert current from said diode configured transistor.

25. A method for reducing the turn-off delay time of a power transistor, a driving node of which is charged and discharged by means of first and second current generators, coupled to said driving node, controlled respectively by a first control signal, which is in phase opposition to a second control signal, to respectively charge and discharge said driving node, comprising the steps of:

generating an additional discharge current by means of a third current generator which is controlled to turn on by a third control signal, which is in phase with said second control signal of said second current generator;

sensing the reaching by the voltage on said driving node of the power transistor of a value close to the saturation value; and interrupting said additional discharge current before the power transistor enters saturation; wherein said sensing step uses a diode configured transistor.

26. A method for reducing the turn-off delay time of a power transistor, a driving node of which is charged and discharged by means of first and second current generators, coupled to said driving node, controlled respectively by a first control signal which is in phase opposition to a second control signal, to respectively charge and discharge said driving node, comprising the steps of:

generating an additional discharge current by means of a third current generator which is controlled to turn on by a third control signal, which is in phase with said second control signal of said second current generator;

sensing the reaching by the voltage on said driving node of the power transistor of a value close to the saturation value; and interrupting said additional discharge current before the power transistor enters saturation; wherein said power transistor is a DMOS transistor, and wherein said sensing step uses a diode configured DMOS transistor.

27. A method of controllable reducing the turn off delay time of a power transistor driving a load, comprising the steps of:, charging a driving node of the power transistor by means of a charge current generated according to a first switching signal;

discharging said driving node of the power transistor by means of first and second discharge currents generated according to a second switching signal, complementary to said first switching signal:

passing said second discharge current through a circuit stage sensing the voltage at said driving node of said power transistor; and impeding the passage of said second discharge current toward said power transistor when the value of the voltage to said driving node of the power transistor is close to a voltage corresponding to saturation of said power transistor;

wherein said step of passing uses at least one current mirror.

28. The method of claim 27, wherein said at least one current mirror has a high current mirror ratio.

29. A method of controllably reducing the turn off delay time of a power transistor driving a load, comprising the steps of:

charging a driving node of the power transistor by means of a charge current generated according to a first switching signal;

discharging said driving node of the power transistor by means of first and second discharge currents generated according to a second switching signal, complementary to said first switching signal;

passing said second discharge current through a circuit stage sensing the voltage at said driving node of said power transistor; and impeding the passage of said second discharge current toward said power transistor when the value of the voltage to said driving node of the power transistor is close to a voltage corresponding to saturation of said power transistor;

wherein said step of impeding uses a diode configured DMOS transistor.

30. The method of claim 29 wherein said power transistor is a DMOS transistor.

* * * * *

UNITED STATES PATENT AND TRADEMARK OFFICE

CERTIFICATE OF CORRECTION

PATENT NO.     :     5,543,739

DATED          :     August 6, 1996

INVENTOR(S)    :     Gregorio Bontempo; Patrizia Milazzo; Angelo Alzati

It is certified that error appears in the above-identified patent and that said Letters Patent is hereby corrected as shown below:

In column 10, claim 26, line 36, change "eaters" to --enters--.

Signed and Sealed this

Eighteenth Day of November 1997

Attest:

BRUCE LEHMAN

Attesting Officer

Commissioner of Patents and Trademarks